United States Patent
Low et al.

(10) Patent No.: US 6,680,500 B1
(45) Date of Patent: Jan. 20, 2004

(54) INSULATING CAP LAYER AND CONDUCTIVE CAP LAYER FOR SEMICONDUCTOR DEVICES WITH MAGNETIC MATERIAL LAYERS

(75) Inventors: Kia-Seng Low, Hopewell Junction, NY (US); John P. Hummel, Verbank, NY (US); Igor Kasko, Fishkill, NY (US); Gregory Costrini, Hopewell Junction, NY (US)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/210,742

(22) Filed: Jul. 31, 2002

(51) Int. Cl.$^7$ ............................ H01L 29/82; H01L 29/96
(52) U.S. Cl. ........................ 257/295; 257/296; 257/421; 257/752
(58) Field of Search .................................. 257/295, 296, 257/421, 422, 752

(56) References Cited

U.S. PATENT DOCUMENTS

| 6,174,737 | B1 | * | 1/2001 | Durlam et al. ................. 438/3 |
| 6,440,753 | B1 | * | 8/2002 | Ning et al. ..................... 438/3 |
| 6,548,849 | B1 | * | 4/2003 | Pan et al. .................... 257/296 |
| 2002/0096775 | A1 | * | 7/2002 | Ning ........................... 257/763 |

* cited by examiner

*Primary Examiner*—Allan R. Wilson
(74) *Attorney, Agent, or Firm*—Slater & Matsil, L.L.P.

(57) ABSTRACT

A semiconductor device (100) and method of fabrication thereof, wherein a plurality of first conductive lines (116) are formed in a dielectric layer (112) over a substrate (110), and an insulating cap layer (140) is disposed over the first conductive lines (116) and exposed portions of the dielectric layer (112). The insulating cap layer (140) is patterned and etched to expose stack portions of the first conductive lines (116). A conductive cap layer (144) is deposited over the exposed portions of the first conductive lines (116). A magnetic material stack (118) is disposed over the insulating cap layer (140), and the magnetic material stack is etched to form magnetic stacks. The insulating cap layer (140) and conductive cap layer (144) protect the underlying first conductive line (116) material during the etching processes.

11 Claims, 4 Drawing Sheets

INSULATING CAP LAYER AND CONDUCTIVE CAP LAYER FOR SEMICONDUCTOR DEVICES WITH MAGNETIC MATERIAL LAYERS

CROSS-REFERENCE TO RELATED APPLICATIONS

The present invention is related to U.S. patent application Ser. No. 10/143,673, filed on May 10, 2002 by Low, entitled "Surface-Smoothing Conductive Layer for Semiconductor Devices with Magnetic Material Layers", which is incorporated herein by reference.

TECHNICAL FIELD

This invention relates to semiconductor devices, and more particularly to semiconductor devices with magnetic material layers.

BACKGROUND OF THE INVENTION

Semiconductor devices are used in many electronic applications. Semiconductor devices are made by depositing, patterning and etching one or more conductive, insulating and semiconductive layers on a semiconductor wafer. Semiconductor devices may include analog or digital circuits, memory devices, logic circuits, or combinations thereof, as examples.

A more recent development in semiconductor memory devices are resistive memory devices, which use magnetics to store a bit of information, rather than storing a charge, as in prior art memory devices such as Dynamic Random Access Memory (DRAM) devices. Magnetic materials are used in the manufacture of resistive memory devices. One such resistive memory device is a Magnetic Random Access Memory (MRAM) device, which is increasing in popularity as a storage device because of its advantages of non-volatility, three dimensional cell packing capability, lower power consumption, and simpler and less expensive processing compared to conventional DRAM devices and non-volatile flash memories, as examples.

MRAM devices use the relative orientation of the magnetization in ferromagnetic materials to store information. Digital information, represented as a "0" or "1", is storable in the alignment of magnetic moments. The resistance of the magnetic component depends on the moment's alignment. The stored state is read from the memory element by detecting the component's resistive state. A memory cell may be constructed by placing conductive lines in a matrix structure having rows and columns, with the memory cells being disposed at the cross-points of the conductive lines.

Manufacturing MRAMs is challenging and presents a different set of problems than conventional memory devices. For example, multiple layers of magnetic materials are used, which often comprise iron and other easily corroded materials. Magnetic material layers may be negatively affected by surface irregularities of underlying layers, which can be problematic in semiconductor processing and may cause Neel coupling.

Also, in the manufacturing of MRAMs, copper is frequently used as the conductive line material to access e.g., read and write information to the magnetic storage cells. Copper corrodes easily and may diffuse into adjacent insulating layers, causing device failures. Because copper is difficult to etch, copper conductive lines are usually formed using a damascene process, in which holes and trenches are formed within a dielectric, and then filled with a conductor. A subsequent Chemical-Mechanical Polishing (CMP) step removes excess copper from the top surface of the dielectric.

When a conventional CMP process is used, the edges of patterned features such as conductive lines 16 tend to have additional edge topography 11, as shown on the substrate 10 in FIG. 1. The edge topography 11 may include protrusions or recesses that extend above or below the conductive line 16 surface, which are caused by erosion and dishing. The conductive lines 16 may include a metallic liner, for example. This edge topography 11 may adversely impact device performance, particularly with MRAM devices. The defects 11 in the edge topography create a surface irregularity, and may distort or cause pinning effects on the magnetic field of the domains of overlying ferromagnetic materials. Distortion and pinning results in undesirable magnetostatic fields. Also, additional edge topography 11 may introduce shorts through the thin magnetic tunneling junction when the magnetic stack is deposited over the edge topography.

Another problem in manufacturing MRAMs is the possibility of overetching the magnetic stack material, which may cause damage to the underlying conductive layer. In order for the MRAM device to function properly, the magnetic stack material is typically required to be adjacent to, or electrically coupled to the underlying conductive line, which may comprise a wordline or bitline of the array, for example. Etching the magnetic stack layer while stopping on the interconnect layer, without corroding or re-sputtering the interconnect metal onto the magnetic stack, is a challenge.

SUMMARY OF THE INVENTION

Embodiments of the present invention achieve technical advantages as a structure and method for preventing problems with the magnetic material stack to underlying conductive line material interface. An insulating cap layer and a conductive cap layer are utilized to prevent a direct interface with the magnetic material stack to the underlying conductive line material. The insulating cap layer is deposited over the conductive lines before the magnetic stack deposition. The insulating cap layer functions as a etch stop when etching the magnetic stack.

In one embodiment, a method of fabricating a semiconductor device includes providing a substrate, depositing a dielectric material over the substrate, and forming a plurality of first conductive lines within the dielectric material. An insulating cap layer is deposited over the first conductive lines and the dielectric material, the insulating cap layer is patterned, and portions of the insulating cap layer are removed from over stack portions of the first conductive lines. A magnetic stack material is deposited over the insulating cap layer.

In another embodiment, a semiconductor device includes a substrate, a dielectric material formed over the substrate, and a plurality of first conductive lines formed within the dielectric material. The first conductive lines include stack portions and non-stack portions. An insulating cap layer is disposed over at least the first conductive line non-stack portions. A magnetic material stack is disposed over each first conductive line stack portion.

Advantages of embodiments of the invention include protecting the underlying first conductive lines with the insulating cap layer during the magnetic stack etch process, preventing corroding or sputtering of the first conductive line material during the magnetic stack etch. Advantageously, the insulating cap layer is adapted to function as an etch stop for the magnetic stack etch. The use of a conductive cap layer over the conductive lines ensures that the magnetic memory cells are formed over a texturally smooth surface, reducing or eliminating Neel coupling effects, minimizing surface topography, and improving MRAM device reliability and performance.

BRIEF DESCRIPTION OF THE DRAWINGS

The above features of the present invention will be more clearly understood from consideration of the following descriptions in connection with accompanying drawings in which.

Corresponding numerals and symbols in the different figures refer to corresponding parts unless otherwise indicated. The figures are drawn to clearly illustrate the relevant aspects of the preferred embodiments and are not necessarily drawn to scale.

DETAILED DESCRIPTION OF PREFERRED EMBODIMENTS

Preferred embodiments of the present invention and some advantages thereof will be discussed.

The present invention achieves technical advantages as a structure and method for protecting underlying first conductive lines during subsequent etching and patterning processes. An insulating cap layer is deposited over first conductive lines, and the insulating cap layer is opened over the conductive lines. A conductive material is deposited over the insulating cap layer, within the insulating cap layer openings.

FIGS. 2–11 illustrate cross-sectional views of a resistive memory device 100 at various stages of fabrication in accordance with a preferred embodiment of the present invention, wherein an insulating cap layer is deposited over conductive lines prior to the magnetic stack material deposition.

Figure 1:
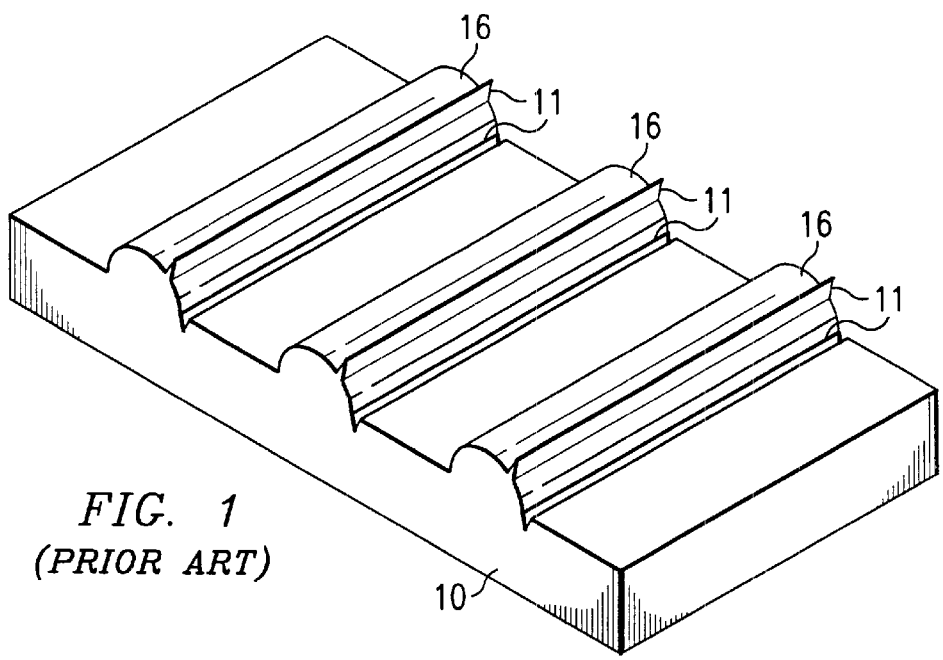
FIG. 1 shows a perspective view of additional edge topography which can form during CMP that can adversely affect MRAM performance.
Figure 2:
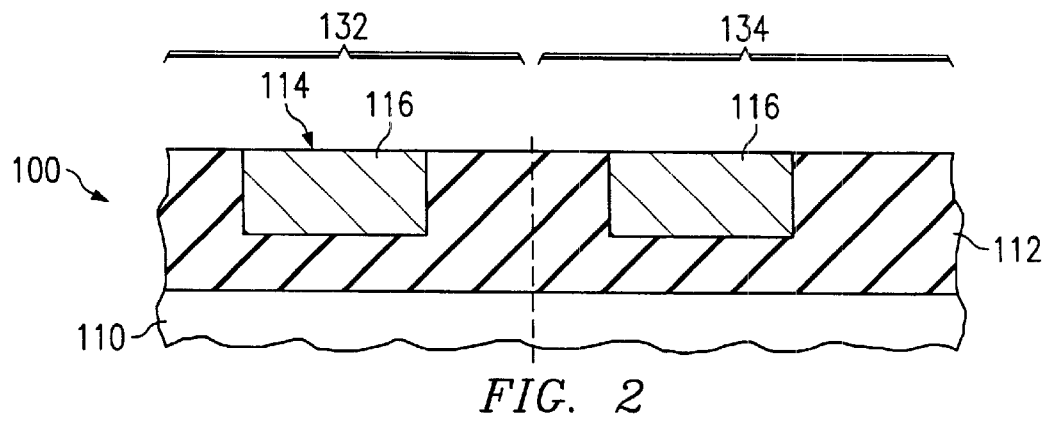
FIGS. 2–11 show cross-sectional views of a processing method and structure in accordance with an embodiment of the present invention, wherein an insulating cap layer is deposited over conductive lines prior to the magnetic stack material deposition.

Referring to FIG. 2, a semiconductor substrate 110 is provided. The substrate 110 may comprise silicon or other semiconductor materials covered by an insulating layer, for example. The substrate 110 may also include other active components or circuits formed in the front end of line (FEOL), not shown. The substrate 110 may comprise silicon oxide over single-crystal silicon, for example. The substrate 110 may include other conductive layers or other semiconductor elements, e.g., transistors, diodes, etc. Compound semiconductors, GaAs, InP, Si/Ge, or SiC, as examples, may be used in place of silicon.

A dielectric material layer 112 is deposited over the substrate 110. The dielectric layer 112 may comprise an insulator such as silicon dioxide or a low dielectric constant (low-k) material such as SILK™, as examples.

A damascene process is used to form conductive lines 116 in the dielectric material layer 112. A plurality of trenches 114 are formed in the dielectric layer 112. The trenches 114 are filled with conductive material to form conductive lines 116. The first conductive lines 116 comprise a plurality of substantially parallel lines, and may comprise wordlines or bitlines of the memory array 100. The conductive lines 116 may include a liner deposited over the dielectric layer 112, comprising Ta, TaN, Ti, TiN, or WN, as examples. The conductive lines 116 preferably comprise a highly conductive material having a low resistance, such as copper, although other conductive materials may be used.

The wafer is polished, for example, using a CMP process, to remove excess conductive line 116 material from the top surface of the dielectric layer 112 to form conductive lines 116 in the array region 132 and the periphery region 134, as shown in FIG. 2. The conductive lines 116 include stack regions, upon which magnetic stacks will later be formed (see FIG. 7). The conductive lines 116 also include non-stack regions, upon which no magnetic stacks will be formed. Alternatively, conductive lines 116 may be formed in a non-damascene process, for example.

Figure 3:
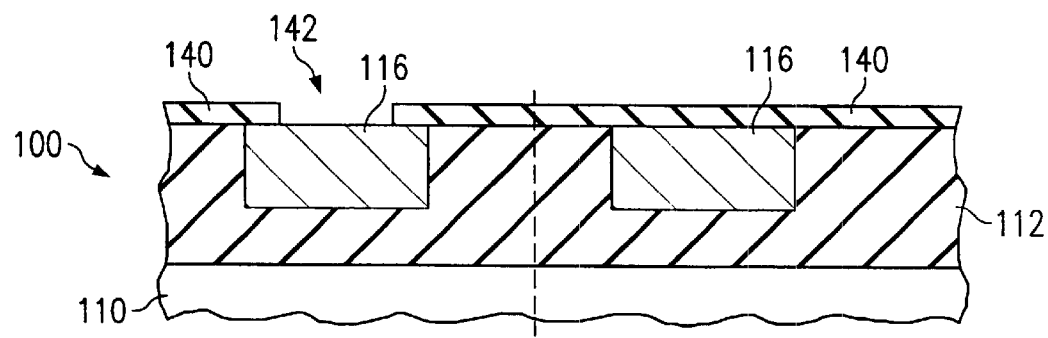

In accordance with a preferred embodiment of the invention, an insulating cap layer 140 is deposited over the conductive lines 116 and exposed portions of the dielectric layer 112, as shown in FIG. 3. The insulating cap layer 140 encapsulates the conductive lines 116 and protects the conductive lines 116 during subsequent etch processes, in particular, the magnetic stack etch. The insulating cap layer 140 preferably comprises an amorphous insulating material. For example, the insulating cap layer 140 may comprise approximately about 100 to 300 Angstroms of silicon nitride. Alternatively, the insulating cap layer 140 may comprise other insulators such as $SiO_2$, for example. The insulating cap layer 140 is patterned and etched, e.g., using lithography, such as a photoresist (not shown), to remove a portion of the insulating cap layer 140 from over the conductive lines 116 stack region at 142 in the array region 132, as shown in FIG. 3.

Figure 4:
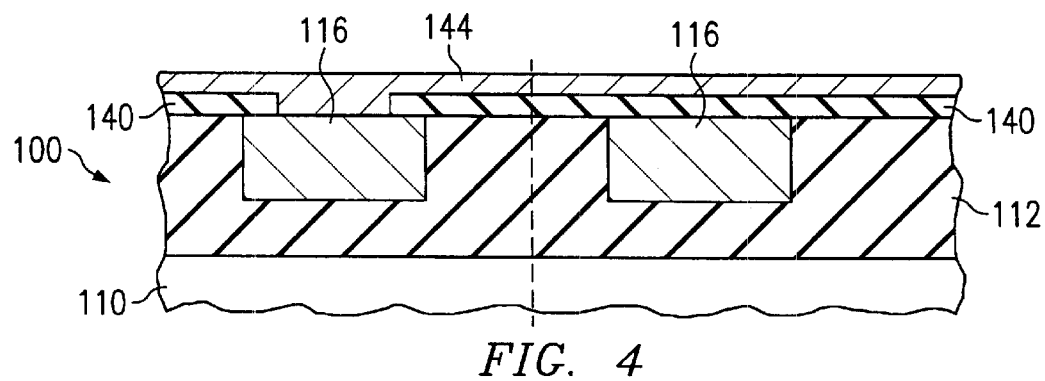

A conductive cap layer 144 is deposited over the insulating cap layer 142, as shown in FIG. 4. The conductive cap layer 144 preferably comprises a conductor such as TaN, and may alternatively comprise Ta, TiN or a copper alloy, as examples, although other conductive materials may also be used. The conductive cap layer 144 is preferably amorphous and is deposited in a thickness of about 400 Angstroms.

The conductive cap layer 144 material may comprise a surface-smoothing conductive material, as described in related U.S. patent application Ser. No. 10/143,673, filed on May 10, 2002 by Low, entitled "Surface-Smoothing Conductive Layer for Semiconductor Devices with Magnetic Material Layers", which is incorporated herein by reference. In this embodiment, the conductive cap material 144 preferably comprises a conductive material having a smaller grain structure and a texturally smoother top surface than the top surface of underlying first conductive lines 116. If the conductive line 116 material is copper, copper has a large grain structure, for example, and preferably the conductive cap material 144 has a smaller grain structure than that of copper.

Figure 5:
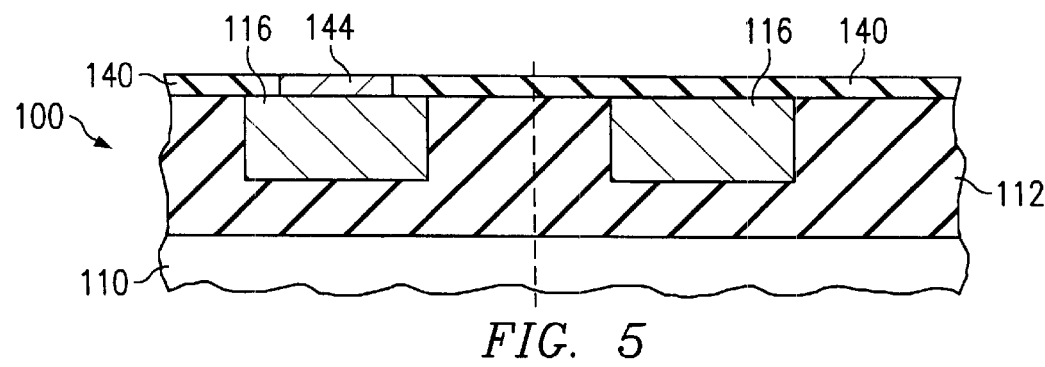

In an optional processing step, the conductive cap layer 144 may be annealed, by heating the wafer to a temperature of less than 300 degrees C. for about 30 minutes, as an example. The conductive cap layer 144 is planarized, for example, using a CMP process, to remove about 100 to 300 Angstroms of the conductive cap layer 144 from the wafer surface from above the insulating cap layer 140, as shown in FIG. 5. About 100 to 300 Angstroms of the conductive cap layer 144 are left remaining over stack portions of the first conductive lines 116.

Figure 6:
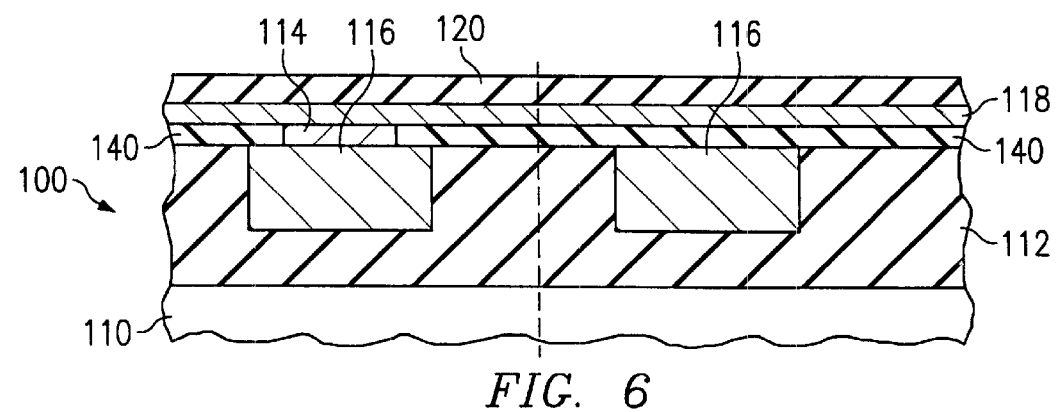

A magnetic stack layer 118, also referred to herein as a magnetic stack material or magnetic material stack, is then deposited on top of the conductive cap layer 144, as shown in FIG. 6. The magnetic stack layer 118 typically comprises a first magnetic layer including one or more layers of materials such as PtMn, NiMn, IrMn, FeMn, CoFe, Ru, Al, and NiFe, for example. The first magnetic layer is often referred to as a hard layer. The magnetic stack also includes a thin dielectric layer comprising $Al_2O_3$, for example, deposited over the first magnetic layer. The dielectric layer is often referred to as a tunnel layer, tunnel junction, or barrier layer. The magnetic stack also includes a second magnetic layer including one or more layers of materials such as PtMn, NiMn, IrMn, FeMn, CoFe, Ru, Al, and NiFe, for example. The second magnetic layer is often referred to as the soft layer. The total thickness of the magnetic stack layer 118 preferably comprises about 400 Angstroms, as an example.

A metallic hardmask 120 is deposited over the magnetic stack layer 118. The metallic hardmask 120 may comprise TiN, and alternatively may comprise TaN, Ta, W or other metals, as examples. The metallic hardmask 120 may be about 500 to 1000 Angstroms thick, as an example.

Figure 7:
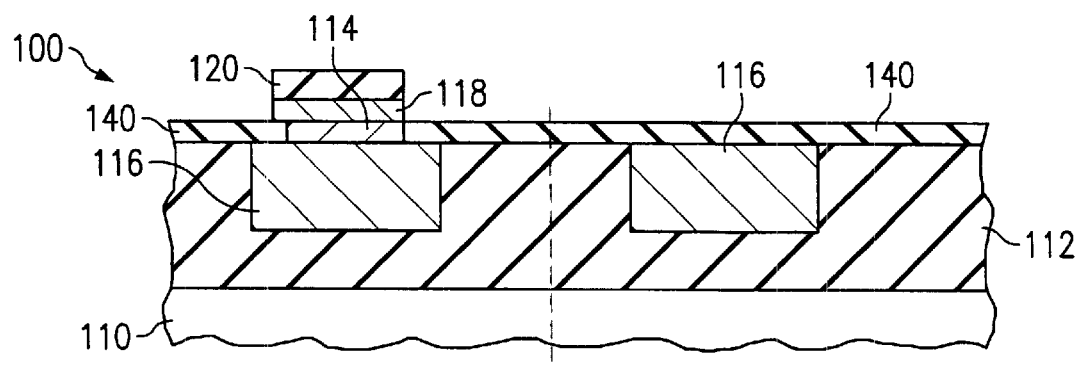

The metallic hardmask 120 and magnetic stack layer 118 are patterned, e.g., using a resist (not shown), and portions of the magnetic stack layer 118 are removed to leave magnetic stacks or magnetic memory cells 118 formed over the conductive lines 116, as shown in FIG. 7. The magnetic stacks 118 are preferably substantially rectangular or oval in shape. The insulating cap layer 140 protects the underlying first conductive lines 116 during the magnetic stack 118 etch process, preventing the reaction of the etchant chemistries with the first conductive line 116 material, and preventing corrosion and sputtering of the underlying conductive line 116 material.

The hardmask 120 may be used to pattern the magnetic stack layer 118, for example. A photoresist (not shown) may be used to pattern the hardmask 120, and then the photoresist is stripped. The pattern of the hardmask 120 is then transferred to the magnetic stack layer 118. The masking process results in the stack layer 118 having exposed and non-exposed portions. The masking process is followed by an etch process, e.g., preferably a plasma etch of the stack layer 118 to remove the exposed portions of the stack layer 118, resulting in the pattern as shown in FIG. 7. The etch process for the magnetic stacks 118 is preferably designed to stop on the insulating cap layer 140, according to an embodiment of the invention. Preferably, the material of the insulating cap layer 140 is selected that is non-reactive with the etchant material used in the etch process for the magnetic stacks 118. For example, a chlorine-based plasma gas may be used as the etchant medium. Silicon nitride does not react with a chlorine etchant gas, and is therefore an example of a preferred material for the insulating cap layer 140.

Figure 8:
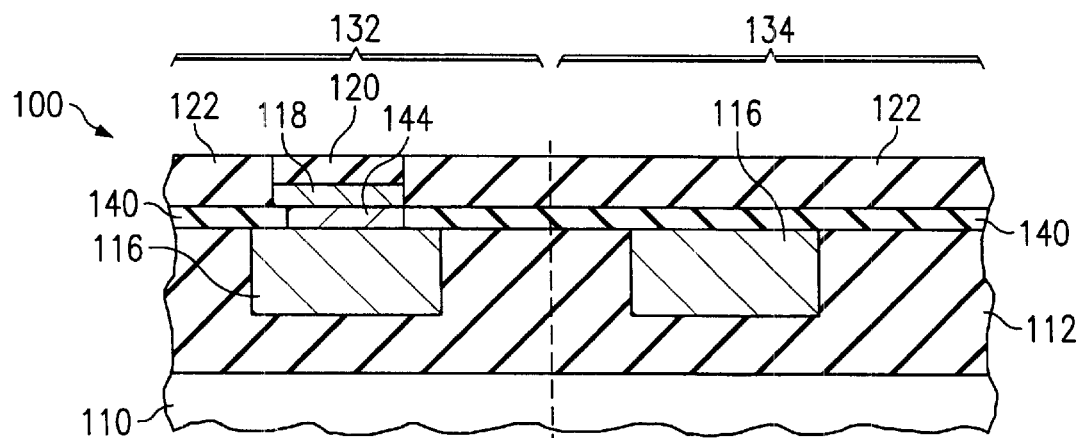

An insulator 122 is deposited over the metallic hardmask 120 and the insulating cap layer 140, as shown in FIG. 8. The insulator 122 may comprise silicon nitride, and alternatively may comprise silicon dioxide, as examples. The insulator 122 preferably comprises a thickness of at least the thickness of the metallic hardmask 120 and insulating cap layer 140. Excess insulator 122 may be removed from the top of the hardmask 120 by polishing, using CMP, for example.

Figure 9:
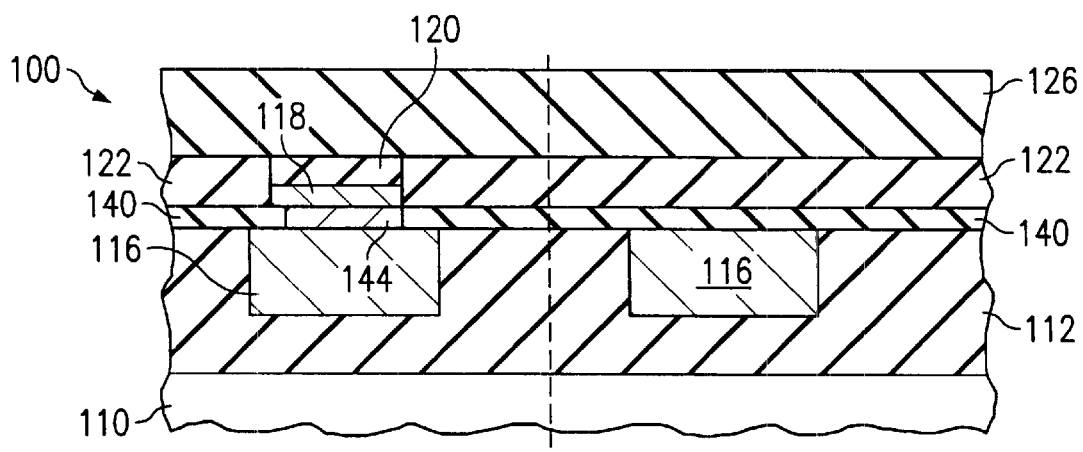

An ILD material 126 is deposited over the hardmask 120 and insulator 122, as shown in FIG. 9. The ILD material 126 preferably comprises silicon dioxide and may alternatively comprise other dielectric materials, such as low-k dielectric materials, as examples.

Figure 10:
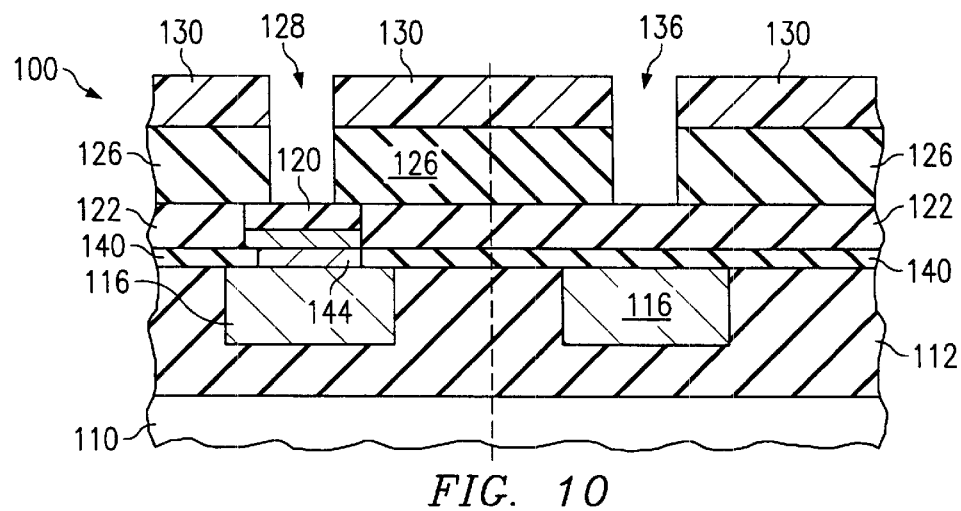

A first resist 130 is deposited over the ILD material 126, and the first resist 130 is patterned and etched. The first resist 130 is used, e.g., in a damascene process, to etch trenches for conductive lines 128 within the ILD material 126 in array regions 132, as shown in FIG. 10. Trenches for contact vias 136 are also formed in this etch step within the ILD material 126, in peripheral regions 134, as shown. The first resist 130 is removed from the wafer.

A second resist (not shown), is deposited over the ILD material 126, and is patterned to remove the second resist from over the contact vias 136 area. The insulator 122 and insulating cap layer 140 are etched, using the second resist to mask the array regions 132 of the wafer. The second resist is then removed from the wafer.

Figure 11:
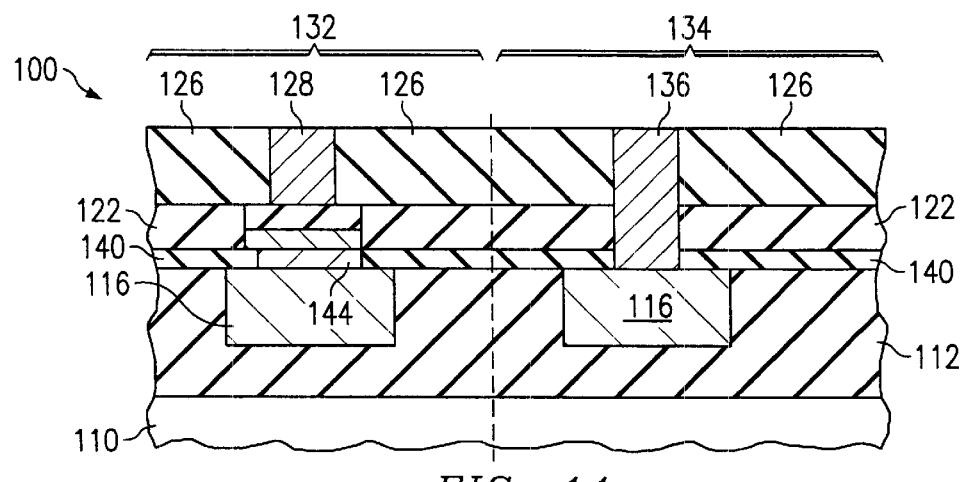

A conductive material is formed, e.g., by deposition or electroplating, in the trenches to form second conductive lines 128 abutting the metallic hard mask 120 in the array region 132 and contacts 136 abutting the conductors 116 in the periphery region 134, as shown in FIG. 11. The second conductive lines 128 comprise a plurality of substantially parallel lines, and may comprise wordlines or bitlines of the memory array 100, as examples. The second conductive lines 128 preferably run in a different direction than the direction of the first conductive lines 116, for example. A magnetic memory cell 118 is disposed at each cross-point where the first and second conductive lines 116/128 overlap. The first and second conductive lines 116/128 are preferably adjacent, e.g., electrically coupled to, the top and bottom surface of the memory cells 118. The wafer is processed to complete the fabrication of the MRAM device 100.

The present invention achieves technical advantages as a structure and method of protecting the first conductive lines 116 during subsequent etch processes. The insulating cap layer 140 protects the underlying first conductive lines 116 during the magnetic stack 118 etch process. Sputtering of the conductive material 116 is therefore prevented during the magnetic stack 118 etch. The insulating cap layer 140 may act as an etch stop for the magnetic stack 118 etch in an embodiment of the invention.

Furthermore, the use of a conductive cap layer 144 over the conductive lines 116 ensures that the magnetic memory cells 118 are formed over a texturally smooth surface. If the magnetic stack 118 and conductive cap layer 144 result in some misalignment over the conductive lines 116, or if there are any surface irregularities such as dishing of the liner (if the conductive lines 116 include a liner), the conductive cap layer 144 provides a smooth surface at the interface of the magnetic stack layer 132. Depositing the magnetic stack material 118 over the smoother textural top surface of the conductive cap layer 144 rather than the texturally rough top surface of the conductive lines 116 reduces or eliminates Neel coupling. The conductive cap layer 144 encapsulates the underlying conductive 116 edge topography, dipping and uneven topography that can occur in underlying layers.

While the invention has been described with reference to illustrative embodiments, this description is not intended to be construed in a limiting sense. Various modifications in combinations of the illustrative embodiments, as well as other embodiments of the invention, will be apparent to persons skilled in the art upon reference to the description. In addition, the order of process steps may be rearranged by one of ordinary skill in the art, yet still be within the scope of the present invention. It is therefore intended that the appended claims encompass any such modifications or embodiments. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A semiconductor device, comprising:
    a substrate;
    a dielectric material formed over the substrate;
    a plurality of first conductive lines formed within the dielectric material, the first conductive lines including stack conductive lines and non-stack conductive lines;
    an insulating cap layer disposed over said first conductive lines and said insulating cap layer defining apertures over said stack conductive lines;
    a conductive cap layer deposited over said insulating cap layer so as to fill said defined apertures, said conductive cap layer then planarized down to the top surface of said insulating cap layer such that said conductive cap layer remains in said apertures over said stack conductive lines; and
    a magnetic material stack disposed on said conductive cap layer remaining in said aperatures.

2. The semiconductor device according to claim 1, wherein the insulating cap layer is amorphous.

3. The semiconductor device according to claim 1, wherein the insulating cap layer comprises silicon dioxide or silicon nitride.

4. The semiconductor device according to claim 1, wherein the insulating cap layer is about 100 to 300 Angstroms thick.

5. The semiconductor device according to claim 1, wherein the insulating cap layer and the conductive cap layer comprise amorphous materials.

6. The semiconductor device according to claim 1, wherein the insulating cap layer comprises silicon dioxide or silicon nitride and the conductive cap layer comprises TaN, Ta, TiN or a copper alloy.

7. The semiconductor device according to claim 1, wherein the first conductive lines have a top surface, wherein the conductive cap layer remaining in said apertures has a top surface, and wherein the conductive cap layer top surface is texturally smoother than the first conductive line top surface.

8. The semiconductor device according to claim 1, wherein the conductive cap layer comprises a material having a smaller grain structure than the first conductive line material.

9. The semiconductor device according to claim 4, wherein the remaining conductive cap layer is about 100 to 300 Angstroms thick.

10. The semiconductor device according to claim 1, wherein the magnetic material stacks comprise magnetic memory cells of a Magnetic Random Access Memory (MRAM) device, further comprising:
    a plurality of second conductive lines disposed over the magnetic memory cells, wherein each magnetic memory cell is located at an intersection of a first and second conductive line.

11. The semiconductor device according to claim 10, further comprising:
    a metallic hardmask disposed over the magnetic stacks;
    an insulator disposed over the insulating cap layer; and
    an inter-level dielectric (ILD) material disposed over the insulating cap layer, wherein the second conductive lines are formed within the ILD material.

* * * * *